United States Patent
Takase et al.

(10) Patent No.: US 6,984,540 B2
(45) Date of Patent: Jan. 10, 2006

(54) SURFACE ACOUSTIC WAVE DEVICE AND METHOD FOR PRODUCING THE SAME

(75) Inventors: Mitihiko Takase, Ikoma (JP); Michio Okajima, Neyagawa (JP); Akihisa Yoshida, Kyoto (JP); Kentaro Setsune, Sakai (JP); Kouzou Murakami, Osaka (JP); Kunihiro Fujii, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 168 days.

(21) Appl. No.: 10/626,822

(22) Filed: Jul. 23, 2003

(65) Prior Publication Data

US 2004/0095038 A1 May 20, 2004

Related U.S. Application Data

(62) Division of application No. 09/668,971, filed on Sep. 25, 2000, now abandoned.

(30) Foreign Application Priority Data

Sep. 30, 1999 (JP) .................................. 11-278683

(51) Int. Cl.
*H01I 21/00* (2006.01)

(52) U.S. Cl. ........................ 438/48; 438/56; 438/510

(58) Field of Classification Search ................. 438/48, 438/56–57, 510–549
See application file for complete search history.

(56) References Cited

U.S. PATENT DOCUMENTS

| 4,072,915 A | | 2/1978 | Mitchell |
| 4,707,059 A | * | 11/1987 | Ogura et al. ................... 385/7 |
| 5,426,340 A | | 6/1995 | Higaki et al. |
| 5,796,205 A | * | 8/1998 | Nishihara et al. ........ 310/313 R |
| 5,889,446 A | | 3/1999 | Yamada et al. |
| 5,923,231 A | * | 7/1999 | Ohkubo et al. ............. 333/193 |

FOREIGN PATENT DOCUMENTS

| EP | 0 893 515 | 1/1999 |
| FR | 2 764 440 | 12/1998 |
| JP | 1-106611 | 4/1989 |
| JP | 3-29407 | 2/1991 |
| JP | 10-303681 | 11/1998 |
| JP | 11-74750 | 3/1999 |
| JP | 11-92147 | 4/1999 |
| JP | 2000-517144 | 12/2000 |
| WO | 98/57426 | 12/1998 |

OTHER PUBLICATIONS

S. M. Sze, pp. 32-33, VLSI technology, 1983, McGraw-Hill Book company.*

* cited by examiner

Primary Examiner—H. Jey Tsai
(74) Attorney, Agent, or Firm—Hamre, Schumann, Mueller & Larson, P.C.

(57) ABSTRACT

A surface acoustic wave device includes a piezoelectric substrate, a first interdigital transducer and a second interdigital transducer formed on the substrate so that the first and second interdigital transducers are opposed to each other. The substrate includes a doping region that is doped with a substance in at least one form selected from the group consisting of atoms, molecules and clusters in a surface between the first and second interdigital transducers.

12 Claims, 12 Drawing Sheets ical difference is generated between the IDT electrodes 3*a* and 3*b* so that discharge occurs between the electrodes. The discharge between the electrodes causes melting and cutting-off of the electrodes, resulting in deterioration or shift of the characteristics of the filter.

SURFACE ACOUSTIC WAVE DEVICE AND METHOD FOR PRODUCING THE SAME

BACKGROUND OF THE INVENTION

1. Field of the Invention

The present invention relates to a surface acoustic wave device and a method for producing the same.

2. Description of the Related Art

A surface acoustic wave device is used, for example, in a high frequency circuit of cellular phones. FIG. 12 shows a SAW filter 1 in a plan view as an example of a conventional surface acoustic wave device (hereinafter, referred to also as a SAW device). The SAW filter 1 includes a piezoelectric substrate 2 and a pair of interdigital transducers 3*a* and 3*b* (hereinafter, referred to also as IDT electrodes) formed on the substrate 2. The substrate 2 is formed of $LiTaO_3$, $LiNbO_3$ or the like.

In the SAW filter 1, if the substrate 2 has a pyroelectric property, a change in temperature in an assembly process or a change in temperature when used as a device causes non-uniformity in electric charge distribution on the surface of the substrate 2. As a result, a potential difference is generated between the IDT electrodes 3*a* and 3*b* so that discharge occurs between the electrodes. The discharge between the electrodes causes melting and cutting-off of the electrodes, resulting in deterioration or shift of the characteristics of the filter.

In order to solve the above problem, the following three methods have been proposed. A first method is to connect the two IDT electrodes by a fine metal electrode (see JP 3-29407A). However, since this metal electrode is fine, the electric connection is easily broken, for example by heat. Thus, this method cannot provide a reliable filter.

A second method is to form a thin film having a predetermined resistivity that covers the IDT electrodes (see JP1-106611A, JP10-303681A, and JP11-74750A). However, in the above method, since the IDT electrodes are covered with the thin film, the characteristics for propagation of surface acoustic waves may be deteriorated. In addition, a process for forming the thin film is required.

A third method is to treat the substrate with heat in a reducing gas to reduce the surface resistance, and then to form IDT electrodes (see JP11-92147A)

However, the SAW filter obtained by the third method has a problem in that insertion loss of high frequency characteristics is increased. It is believed that this is caused by lattice defects generated significantly deep in the substrate when the substrate is treated with heat in a reducing gas, which affects the propagation of the surface acoustic wave energy.

SUMMARY OF THE INVENTION

Therefore, with the foregoing in mind, it is an object of the present invention to provide a surface acoustic wave device in which discharge hardly occurs between the IDT electrodes and that has good characteristics for propagation of surface acoustic waves, and to provide a method for producing the same.

A first surface acoustic wave device of the present invention includes a piezoelectric substrate, a first interdigital transducer and a second interdigital transducer formed on the substrate so that the first and second interdigital transducers are opposed to each other. The substrate includes a doping region that is doped with a substance in at least one form selected from the group consisting of atoms, molecules and clusters in a surface between the first and second interdigital transducers. This substance may be in the form of ions or radicals. This invention is based on the discovery that when the doping region is formed between the electrodes, discharge between the electrodes can be suppressed. While not wishing to be bound by any particular theory, one reason might be that the doping region has a lower resistance than that of the substrate that is not doped. In the above-described SAW device, when a potential difference is generated between the first IDT electrode and the second IDT electrode, electric charges are transferred via the doping region so that the potential difference is eliminated. Therefore, according to the above-described SAW device, discharge between the IDT electrodes can be suppressed. Moreover, in the above-described SAW device, the doping region is formed only in the surface of the substrate. Therefore, the SAW device has good characteristics for propagation of surface acoustic waves.

In the above-described surface acoustic wave device, the depth of the doping region may be not more than 50 nm. Most of the surface acoustic waves that propagate on the surface of the SAW device propagate in a region in a depth up to about ¼ of the wavelength of the surface acoustic wave from the surface of the substrate. In the case of a SAW device with a 2 GHz band using $LiNbO_3$, the surface acoustic waves propagate in a region in a depth up to about 0.5 $\mu$m from the surface of the substrate. This embodiment can provide a SAW device having particularly good characteristics for propagation of the surface acoustic waves, because the doping region is sufficiently thin relative to the region for propagation.

In the above-described surface acoustic wave device, it is preferable that the doping region has a lower resistance than that of an inner portion of the substrate.

In the above-described surface acoustic wave device, the sheet resistance of the doping region may be in a range from $10^8 \Omega/\square$ to $10^{15} \Omega/\square$. This embodiment particularly can suppress discharge between the IDT electrodes.

In the above-described surface acoustic wave device, the substance may be a substance obtained by ionizing at least one selected from the group consisting of a reducing gas, silane, nitrogen, oxygen, argon, silicon, arsenic, boron, phosphorus, tin, indium, chromium, tantalum, molybdenum, germanium, and nickel. This embodiment can prevent electric charges from being accumulated on the substrate, because the conductivity in the vicinity of the surface of the substrate becomes high.

In the above-described surface acoustic wave device, the first and second interdigital transducers may be provided with an insulating layer on surfaces thereof. In this specification, "on a surface" includes "in a surface", and forming on a surface includes forming by doping in a surface. This embodiment can prevent the short-circuit of the electrodes caused by conductive particles. Moreover, this embodiment can prevent corrosion of the electrodes, and this effect is particularly large when the electrodes comprise aluminum. Furthermore, when the insulating layer is formed by doping a metal with impurities, the doping of impurities reduces the grain size of crystals on the surface of the electrodes, so that movement of atoms of Al or the like can be inhibited. Therefore, in this case, migration in the electrodes can be suppressed.

In the above-described surface acoustic wave device, the average thickness of the insulating layer may be in a range from 2 nm to 500 nm, and the resistivity of the insulating layer may be not less than $10^6$ $\Omega$ cm. An average thickness of the layer of 2 nm or more can suppress the short-circuit between the electrodes and corrosion of the electrodes. An average thickness of the layer of 500 nm or less can prevent deterioration of the characteristics of the surface acoustic wave device. Furthermore, a resistivity of the insulating layer of not less than $10^6$ Ω cm particularly can suppress the short-circuit between the electrodes.

In the above-described surface acoustic wave device, the insulating layer may be made of a metal nitride or a metal oxide. This embodiment can prevent not only pyroelectricity breakdown of the electrodes, but also corrosion of the electrodes and the short-circuit between the electrodes.

In another aspect of the present invention, a method for producing a surface acoustic wave device includes (a) forming a first interdigital transducer and a second interdigital transducer on a piezoelectric substrate so that the first and second interdigital transducers are opposed to each other; and (b) forming a doping region in a surface of the substrate between the first and second interdigital transducers by doping the surface of the substrate with a substance in at least one form selected from the group consisting of atoms, molecules and clusters before or after the process (a). This substance may be in the form of ions or radicals. This method can provide a surface acoustic wave device in which discharge between the IDT electrodes hardly occurs and that has good characteristics for propagation of surface acoustic waves.

In the above-described method for producing a surface acoustic wave device, the substrate may be doped with the substance in a depth of not more than 50 nm from the surface thereof. This embodiment allows the doping region to be formed in a depth of not more than 50 nm.

In the above-described method for producing a surface acoustic wave device, it is preferable that the doping region has a lower resistance than that of an inner portion of the substrate. In this case, the sheet resistance of the doping region may be in a range from $10^8$ Ω/□ to $10^{15}$ Ω/□.

In the above-described method for producing a surface acoustic wave device, the substrate may be doped with the substance in ionized form.

In the above-described method for producing a surface acoustic wave device, the dose of the substance may be in a range from $1\times10^{13}$ ions/cm$^2$ to $1\times10^{17}$ ions/cm$^2$. A dose of not less than $1\times10^{13}$ ions/cm$^2$ can form a doping region having a preferable sheet resistance. A dose of not more than $1\times10^{17}$ ions/cm$^2$ particularly can suppress the deterioration of the characteristics of the SAW device.

In the above-described method for producing a surface acoustic wave device, the substrate may be doped with the substance in an energy of 0.01 keV to 10 keV. This embodiment allows the depth of the doping region to be 50 nm or less, and particularly can suppress the deterioration of the characteristics of the SAW device.

In the above-described method for producing a surface acoustic wave device, the substance may be a substance obtained by ionizing at least one selected from the group consisting of a reducing gas, silane, nitrogen, oxygen, argon, silicon, arsenic, boron, phosphorus, tin, indium, chromium, tantalum, molybdenum, germanium, and nickel.

In the above-described method for producing a surface acoustic wave device, the substrate may be doped with the substance by at least one technique selected from the group consisting of ion implantation, ion doping, plasma doping, laser doping and vapor phase doping. This embodiment can form a doping layer simply and controllably.

The above-described method for producing a surface acoustic wave device further may include (c) forming an insulating layer in surfaces of the first and second interdigital transducers by doping the surfaces of the first and second interdigital transducers with impurities after the process (a). This embodiment can prevent the short-circuit between the electrodes caused by conductive particles.

In the above-described method for producing a surface acoustic wave device, the impurities may be the same substance as said substance, and the process (c) may be performed at the same time as the process (b). This embodiment can form the doping region and the insulating layer at one time of doping.

In the above-described method for producing a surface acoustic wave device, the impurities may be oxygen or nitrogen.

In the above-described method for producing a surface acoustic wave device, the average thickness of the insulating layer may be in a range from 2 nm to 500 nm, and the resistivity of the insulating layer may be not less than $10^6$ Ω cm.

A second surface acoustic wave device of the present invention includes a piezoelectric substrate, a first interdigital transducer and a second interdigital transducer formed on the substrate so that the first and second interdigital transducers are opposed to each other, wherein the substrate includes a plurality of conductive regions that spaced apart from each other on a surface thereof between the first and second interdigital transducers, and a tunnel current flows between the first and second interdigital transducers via the conductive regions.

As described above, the SAW device of the present invention and the method for producing a SAW device of the present invention easily provide a surface acoustic wave device in which discharge between the IDT electrodes hardly occurs and that has good characteristics for SAW propagation. The present invention is useful for various SAW devices such as ladder type or traveling-wave type SAW filters or SAW resonators.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

Embodiment 1

Figure 1A:
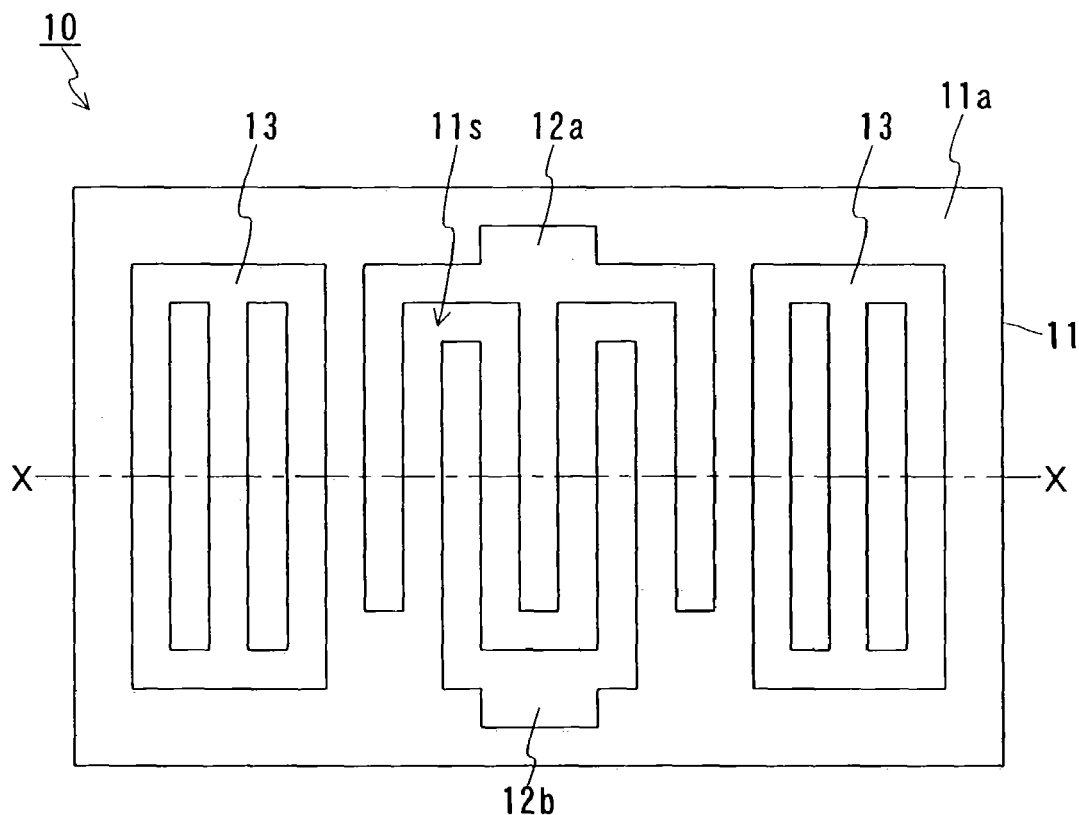
FIG. 1A is a plan view of an example of a SAW device of the present invention.
Figure 1B:
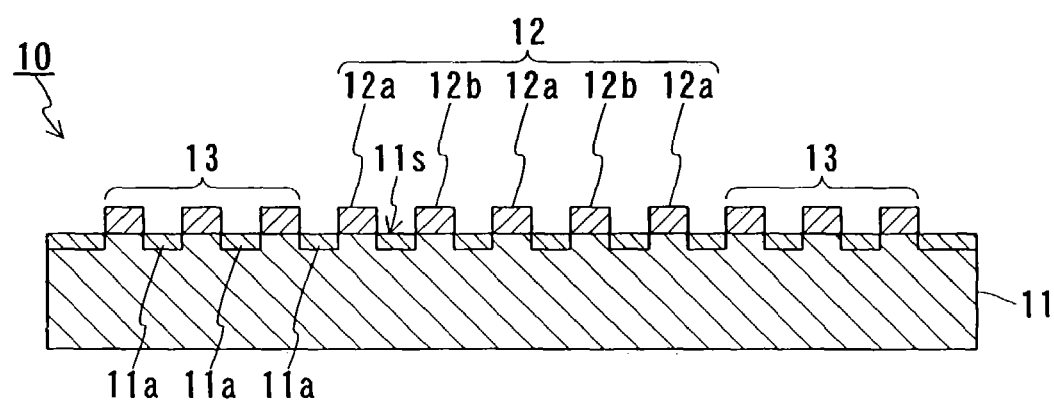
FIG. 1B is a cross-sectional view of the example of the SAW device of the present invention.

In Embodiment 1, a SAW device of the present invention will be described. FIG. 1A is a plan view of a SAW device 10 of Embodiment 1. FIG. 1B is a cross-sectional view of the SAW device 10 taken along line X—X.

Referring to FIGS. 1A and 1B, the SAW device 10 includes a substrate 11, a pair of IDT electrodes 12 formed on the substrate 11, and reflectors 13 formed on the substrate 11. The pair of IDT electrodes 12 includes a first IDT electrode 12a and a second IDT electrode 12b. The substrate 11 includes a doping region 11a in a substrate surface 11s between the first IDT electrode 12a and the second IDT electrode 12b and between the IDT electrodes 12 and the reflectors 13. The SAW device 10 includes electric wires or pad electrodes, if necessary. Furthermore, the SAW device of the present invention may include a plurality of sets of IDT electrodes on the substrate.

A substrate having a piezoelectric property and a pyroelectric property can be used as the substrate 11. Specifically, a substrate made of $LiTaO_3$ or $LiNbO_3$ can be used. More specifically, a 64° Y-cut X-propagating $LiNbO_3$ substrate or a 39° Y-cut X-propagating $LiTaO_3$ substrate can be used.

The doping region 11a in the substrate 11 is doped with a substance in at least one form selected from the group consisting of atoms, molecules and clusters. The substance for doping may be in the form of ions or radicals. The doping region 11a has a lower resistance than that of the inner portion of the substrate. In other words, the doping region 11a has a lower resistance than that of the substrate that is not doped. The resistivity and the depth of the doping region 11a are set to such values that can suppress discharge between the first IDT electrode 12a and the second IDT electrode 12b. Preferably, the depth of the doping region 11a from the substrate surface 11s is 50 nm or less, and more preferably is 10 nm or less.

The sheet resistance of the substrate surface 11s between the first and the second IDT electrodes 12a and 12b, namely, the sheet resistance of the doping region 11a, preferably is in the range from $10^8$ Ω/□ to $10^{15}$ Ω/□, more preferably in the range from $10^{12}$ Ω/□ to $10^{14}$ Ω/□ (The sheet resistance is measured in an electric field of $10^5$ V/cm or less, which also applies to the following). A sheet resistance of $10^8$ Ω/□ or more can suppress the deterioration of the characteristics of the SAW device 10 such as insertion loss.

Discharge between the IDT electrodes 12a and 12b depends on the temperature, the rate of temperature change of the substrate 11, the state of the gas in contact with the surface of the substrate 11, and the state of light with which the substrate is irradiated during the production process or in use. Moreover, the discharge depends on the distance between the two adjacent electrodes, the shape of the ends of the electrodes, and the area of the electrodes. Therefore, the sheet resistance of the doping region 11a is adjusted in view of the aforementioned conditions. The sheet resistance can be adjusted by changing the type or the amount of the substance with which the substrate is doped.

The sheet resistance of a $LiTaO_3$ substrate or a $LiNbO_3$ substrate is about $10^{15}$ Ω/□ or more in an average electric field of $10^5$ V/cm or less when the substrate is not doped. Thus, the sheet resistance of the surface of the doping region 11a has a lower resistance than that of the inner portion of the substrate.

As the substance with which the doping region 11a is doped, for example, a substance obtained by ionizing at least one ion species selected from the group consisting of a reducing gas, silane, nitrogen, oxygen, argon, silicon, arsenic, boron, phosphorus, tin, indium, chromium, tantalum, molybdenum, germanium, and nickel can be used. As the reducing gas, for example, hydrogen, carbon monoxide, nitrogen monoxide or the like can be used. Among these, it is most preferable to use nitrogen as the ion species, because nitrogen causes only a small level of deterioration of the characteristics for propagation of surface acoustic waves.

When a substrate made of an oxide such as $LiTaO_3$ or $LiNbO_3$ is used, it is advantageous to use the reducing gas as the ion species. It is believed that when the reducing gas is used as the ion species, oxygen defects can be formed effectively on the surface of the substrate made of an oxide. More specifically, such oxygen defects act as a donor so that the surface resistance of the doping region 11a can be reduced. Furthermore, when the substrate is made of $LiTaO_3$, it also is advantageous to dope the substrate with carbon or nitrogen. In this case, tantalum carbide or tantalum nitride, which is a compound having a conductivity higher than that of $LiTaO_3$, is formed, so that the surface resistance of the doping region 11a is reduced.

It is believed that also when a neutral gas such as Ar or nitrogen, gas having a relatively large mass, or a metal is used as the ion species, lattice defects can be formed in the substrate surface. It is believed that such lattice defects act as a trap center, a donor, or an acceptor, so that the surface resistance of the doping region 11a is reduced.

In the case where doping is performed with accelerated ions, the accelerating energy for doping can be in the range from 0.01 keV to 10 keV. The dose in this case can be any amount, as long as the sheet resistance as described above is attained. For example, a dose of $1 \times 10^{13}$ ions/cm² to $1 \times 10^{17}$ ions/cm² can be used.

FIGS. 1A and 1B show the IDT electrodes 12 only schematically, and IDT electrodes 12 for practical use are provided with more branches, for example, 100 to 500 branches. The IDT electrodes are made of Al, an Al alloy or other metals. As an Al alloy, for example, an Al—Cu alloy or an Al—Cu—Si alloy can be used. The IDT electrodes 12 can be formed with a single metal film or a plurality of metal films. The shortest distance between the first IDT electrode 12a and the second IDT electrode 12b depends on the speed of sound as determined by the frequency and the substrate material. For example, the shortest distance therebetween is in the range from 0.01 μm to 100 μm.

The reflectors 13 are formed to suppress leakage of the surface acoustic waves from the IDT electrodes 12. The reflectors are formed in such a manner that the IDT electrodes 12 are interposed between the reflectors. The reflectors can be made of the same material as used for the IDT electrodes 12.

The SAW device 10 can be used as a single device or in connection with a package, which encloses the SAW device. The SAW device 10 can be connected to the package by wire bonding or flip chip bonding.

FIGS. 1A and 1B show the SAW device where the doping region 11a is formed only between adjacent electrodes (including the IDT electrodes and the reflectors) on the substrate 11. However, as shown in FIG. 6D, the doping region can be formed in the entire surface of the substrate on the side where the IDT electrodes are formed.

Figure 2:
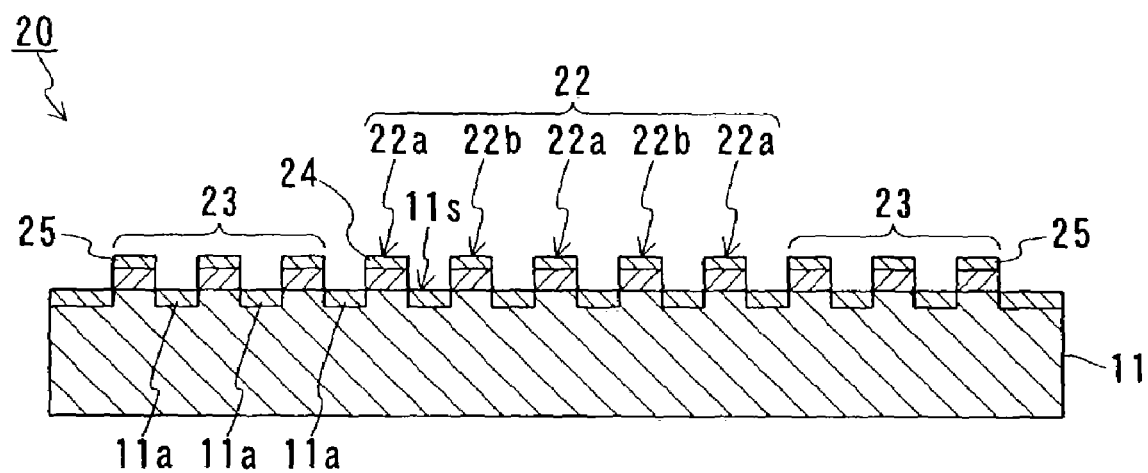
FIG. 2 is a cross-sectional view of another example of a SAW device of the present invention.

Furthermore, the SAW device of the present invention may include an insulating layer on the surface of the IDT electrodes. FIG. 2 shows an example of such a SAW device 20 in section. The SAW device 20 is different from the SAW device 10 only in the IDT electrodes and the reflectors, so that duplicate description will be omitted.

The SAW device 20 includes IDT electrodes 22 and reflectors 23 formed on the substrate 11. The IDT electrodes 22 include a first IDT electrode 22a and a second IDT electrode 22b. The first IDT electrode 22a and the second IDT electrode 22b are the first IDT electrode 12a and the second IDT electrode 12b provided with an insulating layer 24 on the surfaces thereof, respectively. In other words, the IDT electrodes 22 are provided with the insulating layer 24 on the surfaces thereof. Furthermore, the reflectors 23 are provided with an insulating layer 25 on the surface thereof. The resistivity of the insulating layers 24 and 25 is, for example, $10^6$ Ω cm or more. The insulating layers 24 and 25 are made of, for example a metal nitride or a metal oxide. For example, aluminum nitride or aluminum oxide can be used for the insulating layers 24 and 25. The thickness of the insulating layers 24 and 25 preferably is 2 nm to 500 nm, more preferably 2 nm to 10 nm. The insulating layer 24 can be formed by doping the surface of the IDT electrodes made of a metal with impurities that form an insulator with the metal. Similarly, the insulating layer 25 can be formed by doping the reflectors made of a metal with impurities. Examples of the impurities include nitrogen and oxygen. Doping of the impurities can be performed in the same manner in which the doping region 11a is formed, which will be described in Embodiment 2.

The SAW device of Embodiment 1 can be produced in the same manner as described in Embodiment 2.

In the SAW device of Embodiment 1, the doping region 11a is formed in the substrate surface 11s. Therefore, this SAW device can prevent discharge between the electrodes from occurring during and after production. Furthermore, since the doping region 11a is formed only in the surface of the substrate 11, the SAW device has good characteristics for propagation of surface acoustic waves.

Moreover, the SAW device of Embodiment 1 can be miniaturized, because it is unnecessary to form metal electrodes for connection, unlike conventional SAW devices where the IDT electrodes are connected by metal electrodes.

Embodiment 2

In Embodiment 2, a method of the present invention for producing a SAW device will be described. The same components as those described in Embodiment 1 bear the same reference numerals, and duplicate description will be omitted.

The method of Embodiment 2 includes (a) forming a first IDT electrode and a second IDT electrode on a piezoelectric substrate in such a manner that the first IDT electrode and the second IDT electrode are opposed to each other. Hereinafter, this process may be referred to as process (a).

Furthermore, this method includes (b) forming a doping region in a surface of the substrate by doping the surface of the substrate between the first IDT electrode and the second IDT electrode with a substance in at least one form selected from the group consisting of atoms, molecules and clusters before or after the process (a). Hereinafter, this process may be referred to as process (b). The substance with which the substrate is doped may be in the form of ions or radicals.

Hereinafter, an example of the method of Embodiment 2 will be described with reference to FIGS. 3A to 3C. The drawings of the production process described below show only a part of the substrate. In the actual production process, a plurality of devices may be formed in a substrate and the substrate will be divided, if necessary.

Figure 3A:
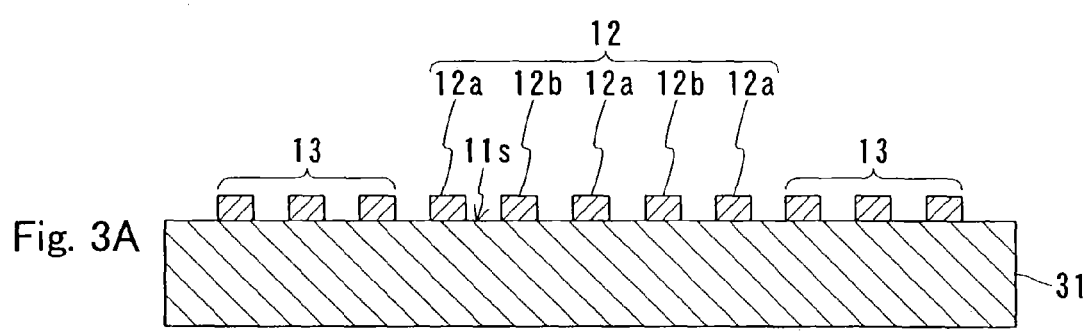
FIGS. 3A to 3C are views showing a process sequence of an example of a method for producing a SAW device of the present invention.

In this method, first, as shown in FIG. 3A, a pair of IDT electrodes 12 and reflectors 13 are formed on a substrate 31. A first IDT electrode 12a and a second IDT electrode 12b are opposed to each other. The substrate 31 becomes the substrate 11. The IDT electrodes 12 can be formed by photo-litho-etching or lift-off technology.

Figure 3B:
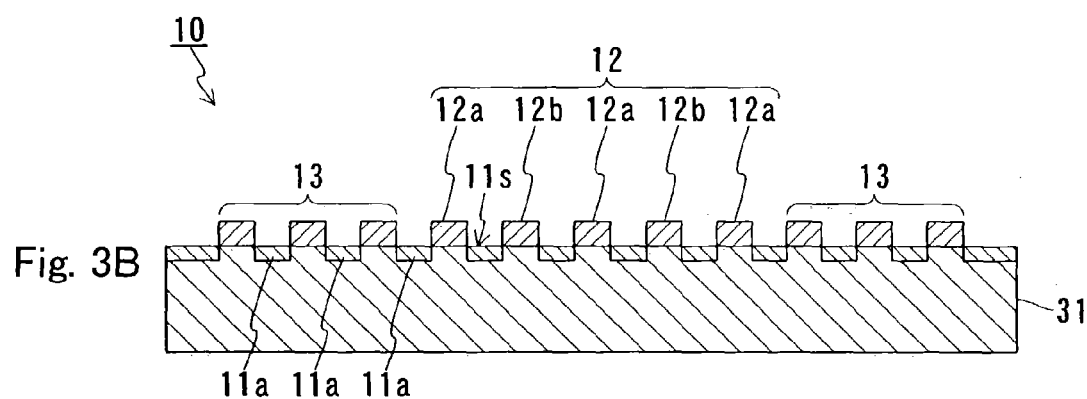

Thereafter, as shown in FIG. 3B, the doping region 11a is formed in the substrate surface 11s at least between the first IDT electrode 12a and the second IDT electrode 12b and between the IDT electrodes 12 and the reflectors 13. The doping region 11a can be formed by doping the substrate surface 11s with a substance in at least one form selected from the group consisting of atoms, molecules and clusters (hereinafter, the substance may be referred to as an additive substance). Thus, the SAW device 10 provided with the substrate 11 can be produced.

It is preferable to dope the substrate surface 11s with the additive substance in a depth of not more than 50 nm (more preferably, not more than 10 nm) from the substrate surface 11s. In other words, it is preferable that the depth of the doping region 11a is not more than 50 nm. The doping region 11a has a lower resistance than that of the inner portion of the substrate. The sheet resistance of the substrate surface 11s, namely, the doping region 11a, preferably is in the range from $10^8$Ω/□ to $10^{15}$Ω/□, more preferably in the range from $10^{12}$Ω/□ to $10^{14}$Ω/□.

The additive substance can be used in the form of ions for doping. In this case, the dose of ions can be any amount, as long as the sheet resistance as described above is attained. For example, a dose of $1\times10^{13}$ ions/cm² to $1\times10^{17}$ ions/cm² can be used. Furthermore, in the case where doping is performed while accelerating ions, the accelerating energy for the doping can be in the range from 0.01 keV to 10 keV. In particular, in the case where nitrogen ions are used for doping, it is preferable that doping is performed at an accelerating energy of 0.05 keV to 0.3 keV.

As the additive substance, for example, a substance obtained by ionizing at least one ion species selected from the group consisting of a reducing gas, silane, nitrogen, oxygen, argon, silicon, arsenic, boron, phosphorus, tin, indium, Cr, Ta, Mo, Ge, and Ni can be used. As the reducing gas, for example, hydrogen, carbon monoxide, nitrogen monoxide or the like can be used. As atoms with which the substrate is doped, nitrogen radicals or oxygen radicals can be used.

When a substrate made of an oxide such as $LiTaO_3$ or $LiNbO_3$ is used, it is advantageous to use the reducing gas as the ion species. Furthermore, it also is advantageous to use a neutral gas such as Ar or nitrogen, gas having a relatively large mass, or metal ions.

The doping of the additive substance can be performed by at least one technique selected from the group consisting of ion implantation, ion doping, plasma doping, laser doping and vapor phase doping. In the ion implantation technique, doping is performed by accelerating ions generated in plasma and separating the ions by mass. In the ion doping technique, doping is performed by accelerating ions generated in plasma without separating the ions by mass. In the plasma doping, doping is performed by exposing the substrate to plasma. In the laser doping technique, doping is performed by irradiating the surface of the substrate with a laser while exposing the substrate to a gas comprising atoms with which the substrate is to be doped. In the vapor phase doping technique, doping is performed by exposing the substrate to a gas comprising atoms with which the substrate is to be doped and then treating the substrate with heat. Among these, plasma doping is preferable in that it is a low-temperature and low energy process, and therefore a shallow doping region can be formed easily.

Figure 4:
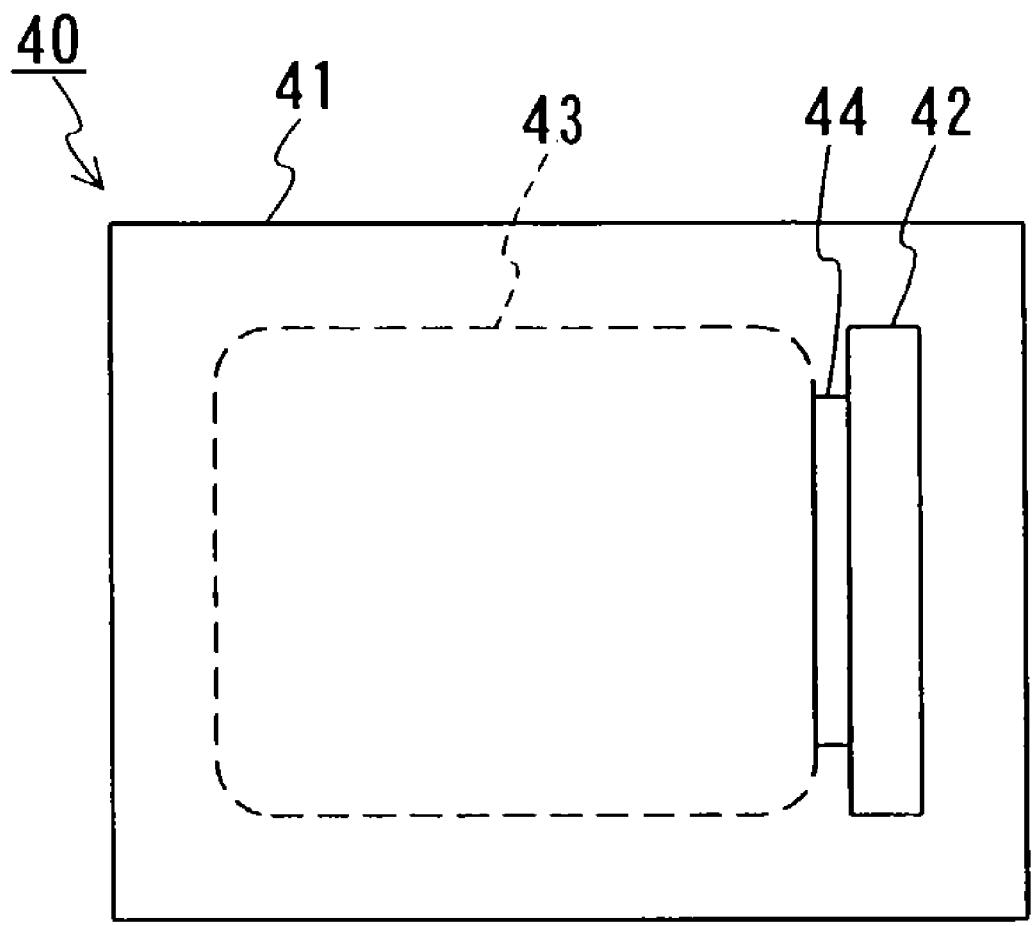
FIG. 4 is a schematic view showing an example of a plasma doping apparatus used in a method for producing a SAW device of the present invention.

FIG. 4 schematically shows the structure of an example of a plasma doping apparatus. The doping apparatus 40 includes a chamber 41 and a substrate stage 42 placed in the chamber 41. A tube for gas supply (not shown) and a tube for exhaustion (not shown) are connected to the chamber 41. Plasma 43 is formed immediately above the substrate stage 42. A substrate 44 on the substrate stage 42 is exposed to the plasma 43 and doped with radicals or ions in the plasma 43. The plasma 43 is formed by RF electrodes (not shown) provided in the chamber 41.

Figure 5:
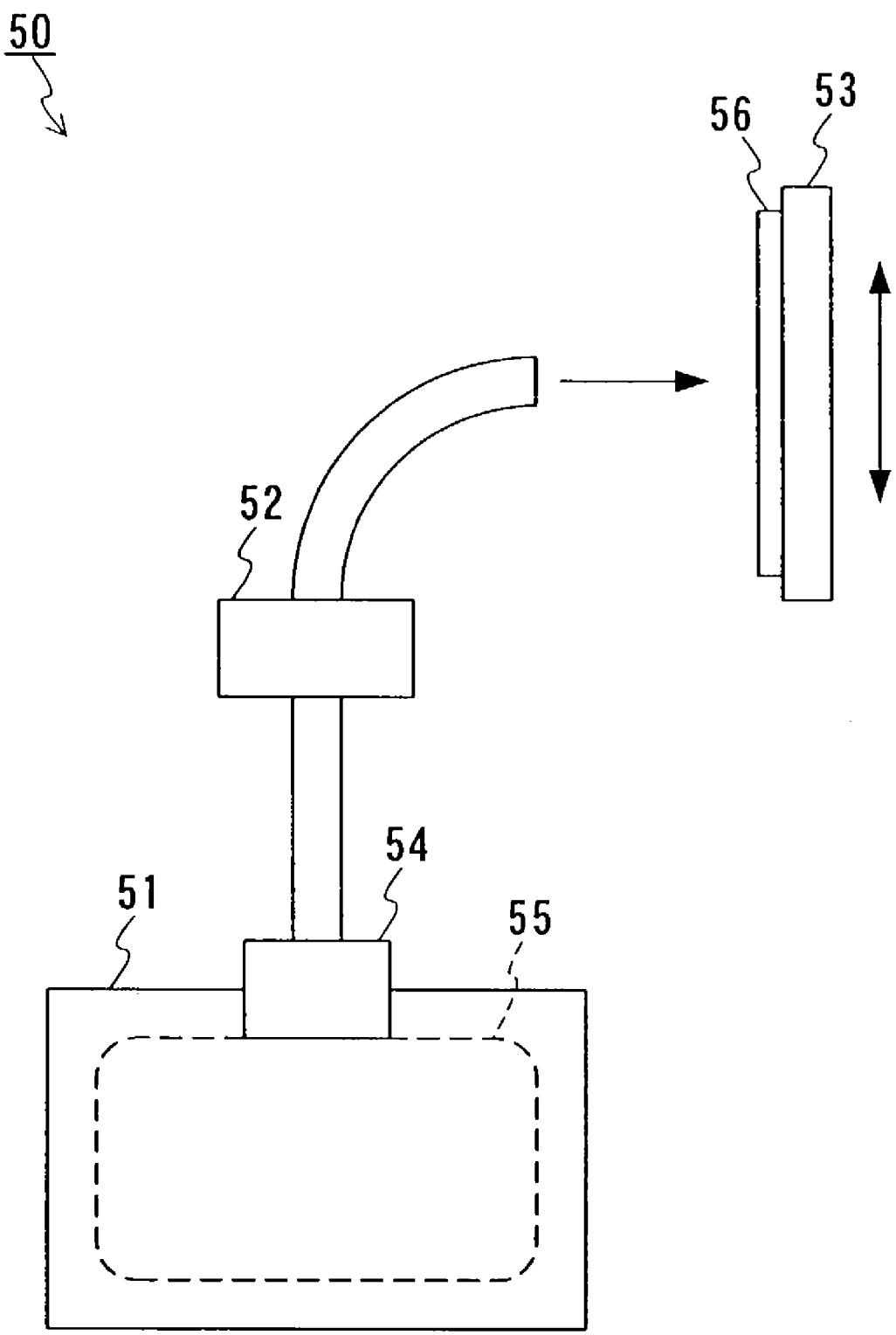
FIG. 5 is a schematic view showing an example of an ion implanting apparatus used in a method for producing a SAW device of the present invention.

FIG. 5 schematically shows the structure of an example of an ion implanting apparatus. The ion implanting apparatus 50 includes a chamber 51, a mass separator 52 connected to the chamber 51 and a substrate stage 53. A tube for gas supply (not shown) and a tube for exhaustion (not shown) are connected to the chamber 51. Outside the chamber 51, there is an extracted electrode 54 for ions. The chamber 51, the mass separator 52 and the substrate stage 53 are placed substantially under vacuum. The substrate stage 53 is movable. A substrate 56 is placed on the substrate stage 53. Plasma 55 is formed in the chamber 51. Ions generated in the plasma 55 are extracted from the chamber 51 by the extracted electrode 54, accelerated by a pre-accelerator (not shown), separated by the mass separator 52, and accelerated or decelerated by post-accelerator (not shown), if necessary, and then implanted on the substrate 56. The plasma 55 is formed by RF electrodes provided in the chamber 51.

Figure 3C:
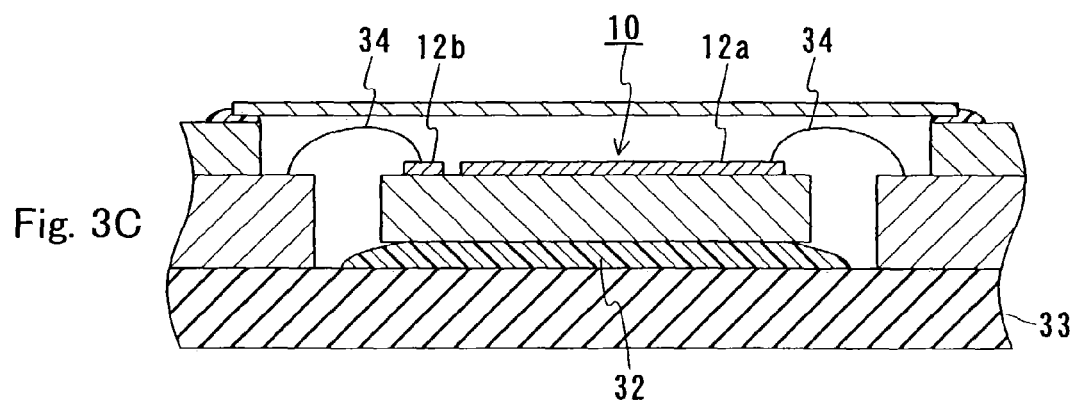

The SAW device 10 can be mounted in the manner shown in FIG. 3C. In the mounting process, first, the substrate 11 is cut into individual elements, and then an element is fixed to a mounting substrate 33 with a resin 32. Then, wire bonding is performed using a bonding wire 34, and seam welding is performed in a nitrogen atmosphere. In this mounting process, the substrate 11 is heated. However, discharge can be prevented because the substrate 11 is provided with the doping region 11a.

In the above method, when the process (b) is performed before the process (a), the doping region may be etched during a process for forming the IDT electrodes 12 (e.g., dry etching). For this reason, in this case, the conditions for the process for forming the IDT electrodes are restricted. On the other hand, when the process (b) is performed after the process (a), such restrictions can be eliminated.

When the process (b) is performed after the process (a), there is an advantage in that equipment or material can be shared with an apparatus used in another process. Examples of the apparatus used in another process include a sputtering cleaning apparatus, a dry etching apparatus, and a resist ashing apparatus. Examples of the equipment that can be shared include a chamber, an ionizer, an exhausting apparatus and a gas tube. In particular, when the substrate is doped with ions by a plasma doping technique, doping of the ions can be performed using a dry etching apparatus. In this case, a dry etching process and the plasma doping process can be performed successively in the same chamber or different chambers. In this manner, the SAW device can be produced with good production yield and reliability by performing the process (b) after process (a).

When the SAW device 20 described in Embodiment 1 is produced, the method of the present invention may include a process for forming the insulating layers 24 and 25 by doping the surfaces of the IDT electrodes 12 and the reflectors 13 with impurities after the process (a). Hereinafter, this process may be referred to as process (c).

The insulating layers 24 and 25 can be formed after removing a resist on the electrodes. More specifically, the insulating layers 24 and 25 can be formed before the process (b), at the same time as the process (b), or after the process (b).

When the impurities in the process (c) are the same substance as the additive substance in the process (b), the processes (b) and (c) can be performed at the same time by one doping process. More specifically, when the IDT electrodes 12 and the reflectors 13 are made of a metal comprising Al, it is preferable to dope the substrate 31, the IDT electrodes 12 and the reflectors 13 with nitrogen or oxygen. In this case, the insulating layers are formed most efficiently by using nitrogen radials and oxygen radicals for doping.

The method of Embodiment 2 can produce a SAW device in which discharge hardly occurs between the IDT electrodes and that has good characteristics for propagation of surface acoustic waves. Moreover, the method of Embodiment 2 can suppress discharge during production processes, so that the SAW device can be produced in good yield.

EXAMPLES

Hereinafter, the present invention will be described in detail by way of examples. Examples 1 to 4 are examples that can be carried out, and Example 5 is an example that was actually carried out. In the SAW devices in the following examples, a reflector is not formed. However, a reflector can be formed.

Example 1

In Example 1, an example of a method for producing a SAW device of the present invention will be described. FIGS. 6A to 6D show a production process sequence of Example 1.

Figure 6A:
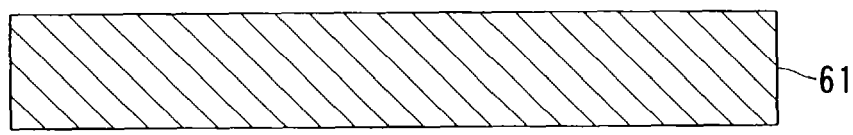
FIGS. 6A to 6D are views showing a process sequence of another example of a method for producing a SAW device of the present invention.
Figure 6B:
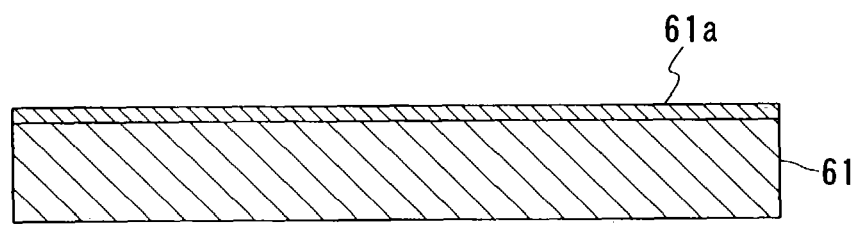

First, as shown in FIG. 6A, a substrate 61 made of $LiTaO_3$ is prepared, and the surface thereof is washed. Then, as shown in FIG. 6B, a doping region 61a having a sheet resistance in the range from $10^8 \Omega/\square$ to $10^{15} \Omega/\square$ is formed in the substrate 61. The doping region 61a can be formed by doping the substrate 61 with boron ions by plasma doping. The doping of boron ions can be performed under the conditions of an implantation energy of 700 eV and a dose of $1 \times 10^{16}$ ions/cm$^2$.

Figure 6C:
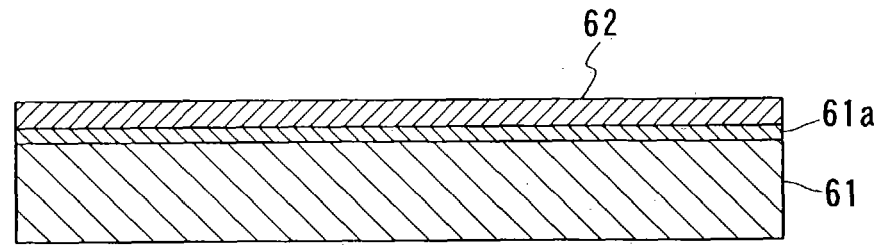
Figure 6D:
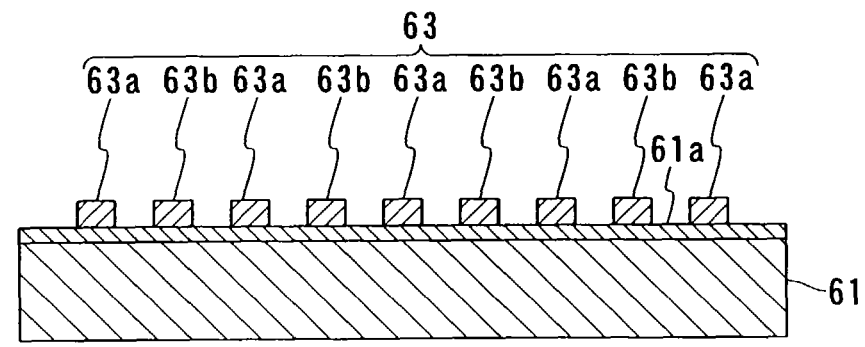

Then, as shown in FIG. 6C, a metal film 62 (a thickness of 800 nm) made of aluminum is formed over the substrate 61 by sputtering.

Then, as shown in FIG. 6D, IDT electrodes 63a and 63b are formed by removing unnecessary portions in the metal film 62. The IDT electrodes are formed in the following manner. First, a resist film (a thickness of 1 μm) is formed on the metal film 62, and a predetermined pattern is formed by photolithography. Then, unnecessary portions in the metal film 62 are removed by dry-etching using a chlorine-based gas. Finally, the resist film is ashed with oxygen plasma. Thus, the formation of the IDT electrodes is completed.

Thereafter, the mounting of the SAW device is performed. Specifically, first, the substrate 61 is diced and cut into individual elements. Next, die bonding is performed at 180° C. with a silicon resin to bond the substrate 61 to a mounting substrate. Then, wire bonding is performed to the IDT electrodes 63a and 63b. Finally, seam welding is performed in a nitrogen atmosphere.

As described above, in the method of Example 1, ions are implanted before the IDT electrodes are formed. According to the SAW device produced by the method of Example 1, discharge between the electrodes can be prevented.

As the ion species, a nitrogen gas comprising 0.1 vol % to 5 vol % of hydrogen, or a helium gas comprising 0.1 vol % to 5 vol % of hydrogen may be used. In this case, for example, plasma doping can be performed under the conditions of an implanting energy of 700 eV and a dose of $1 \times 10^{16}$ ions/cm$^2$.

Example 2

Figure 7A:
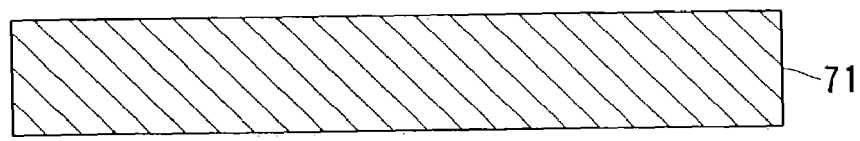
FIGS. 7A to 7C are views showing a process sequence of yet another example of a method for producing a SAW device of the present invention.
Figure 7B:
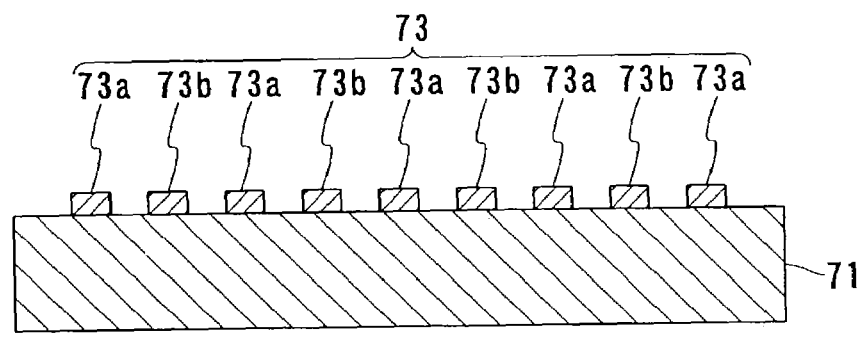
Figure 7C:
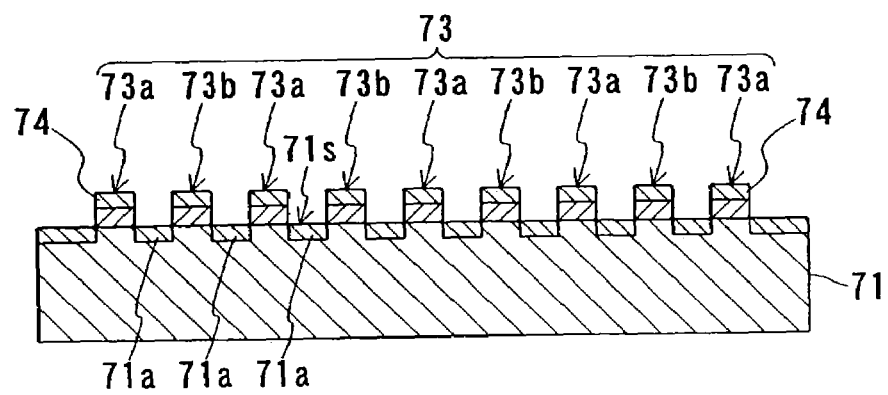

In Example 2, another example of a method for producing a SAW device of the present invention will be described. FIGS. 7A to 7C show a production process sequence of Example 2.

First, as shown in FIG. 7A, a substrate 71 made of LiTaO$_3$ is prepared, and the surface thereof is washed.

Then, as shown in FIG. 7B, IDT electrodes 73 including IDT electrodes 73a and 73b are formed. The IDT electrodes are formed in the following manner. First, a metal film (a thickness of 200 nm) made of aluminum is formed on a substrate 71, and a resist film (a thickness of 1 μm) having a predetermined pattern is formed on the metal film. Then, unnecessary portions in the metal film are removed by dry-etching using a chlorine-based gas. Finally, the resist film is ashed with oxygen plasma. Thus, the formation of the IDT electrodes is completed.

Then, as shown in FIG. 7C, an insulating layer 74 is formed on the IDT electrodes 73a and 73b. At the same time, a doping region 71a having a sheet resistance in the range from $10^8 \Omega/\square$ to $10^{15} \Omega/\square$ is formed in a substrate surface 71s between the IDT electrodes 73a and 73b. The insulating layer 74 and the doping region 71a can be formed by doping the substrate 71 with oxygen ions by plasma doping. The doping of oxygen ions can be performed under the conditions of an implantation energy of 5000 eV and a dose of $1 \times 10^{17}$ ions/cm$^2$.

Finally, the SAW device is mounted on a mounting substrate in the same manner as in Example 1.

As described above, in the method of Example 2, ions are implanted after the IDT electrodes are formed and the resist film is removed. According to the SAW device produced by the method of Example 2, discharge between the electrodes can be prevented. Moreover, by forming the insulating layer on the surfaces of the electrodes, the method of Example 2 can suppress a short-circuit generated by conductive particles adhering during the production process. Furthermore, according to the SAW device produced by the method of Example 2, corrosion of the electrodes and stress migration can be suppressed.

Example 3

Figure 8A:
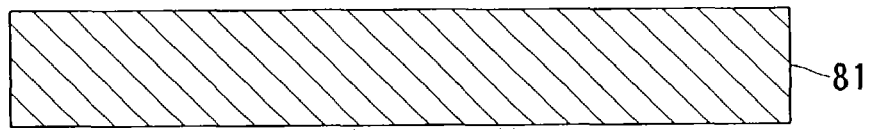
FIGS. 8A to 8C are views showing a process sequence of still another example of a method for producing a SAW device of the present invention.
Figure 8B:
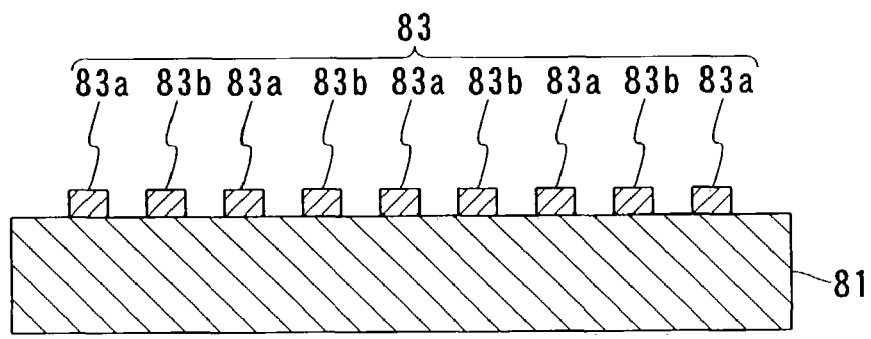
Figure 8C:
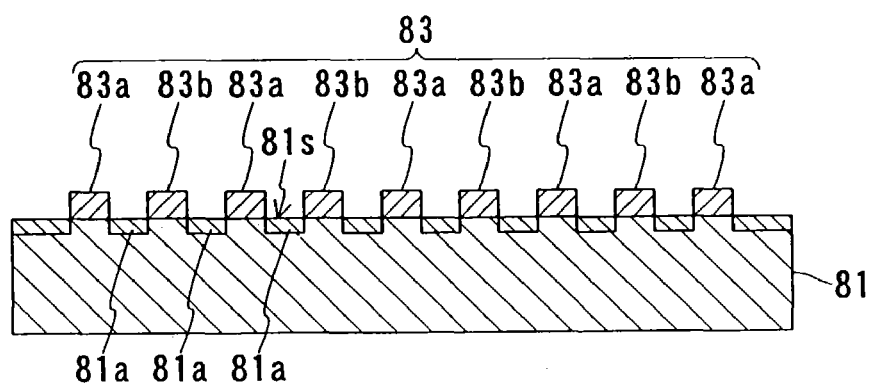

In Example 3, another example of a method for producing a SAW device of the present invention will be described. FIGS. 8A to 8C show a production process sequence of Example 3.

First, as shown in FIG. 8A, a substrate 81 made of LiTaO$_3$ is prepared, and the surface thereof is washed.

Then, as shown in FIG. 8B, IDT electrodes 83 including IDT electrodes 83a and 83b are formed. The IDT electrodes are formed in the same manner as in Example 2.

Then, as shown in FIG. 8C, a doping region 81a having a sheet resistance in the range from $10^8 \Omega/\square$ to $10^{15} \Omega/\square$ is formed in a substrate surface 81s between the IDS electrodes 83a and 83b. The doping region 81a can be formed by doping the substrate 81 with boron ions by plasma doping. The doping of boron ions can be performed under the conditions of an implantation energy of 700 eV and a dose of $1 \times 10^{16}$ ions/cm$^2$. When the boron ions are implanted, the boron ions are implanted also in the IDT electrodes. However, this does not affect the electric characteristics of the SAW device.

Finally, the SAW device is mounted on a mounting substrate in the same manner as in Example 1.

As described above, in the method of Example 3, ions are implanted after the IDT electrodes are formed. According to the SAW device produced by the method of Example 3, discharge between the electrodes can be prevented.

As the ion species, a nitrogen gas comprising 0.1 vol % to 5 vol % of hydrogen, or a helium gas comprising 0.1 vol % to 5 vol % of hydrogen may be used. In this case, for example, plasma doping can be performed under the conditions of an implanting energy of 700 eV and a dose of $1 \times 10^{16}$ ions/cm$^2$.

Example 4

In Example 4, another example of a method for producing a SAW device of the present invention will be described. FIGS. 9A to 9D show a production process sequence of Example 4.

Figure 9A:
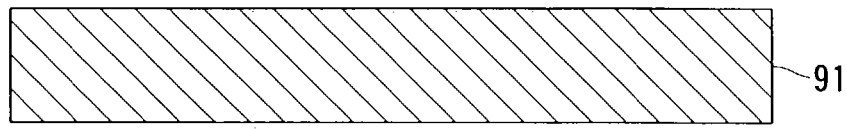
FIGS. 9A to 9D are views showing a process sequence of another example of a method for producing a SAW device of the present invention.

First, as shown in FIG. 9A, a substrate 91 made of LiTaO$_3$ is prepared, and the surface thereof is washed.

Figure 9B:
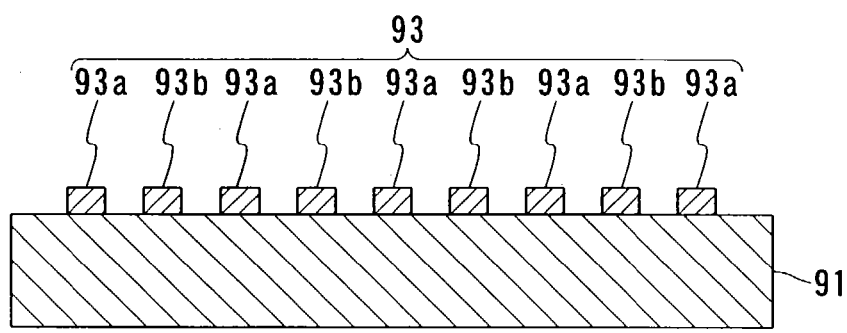

Then, as shown in FIG. 9B, IDT electrodes 93 including IDT electrodes 93a and 93b are formed. The IDT electrodes are formed in the same manner as in Example 2.

Figure 9C:
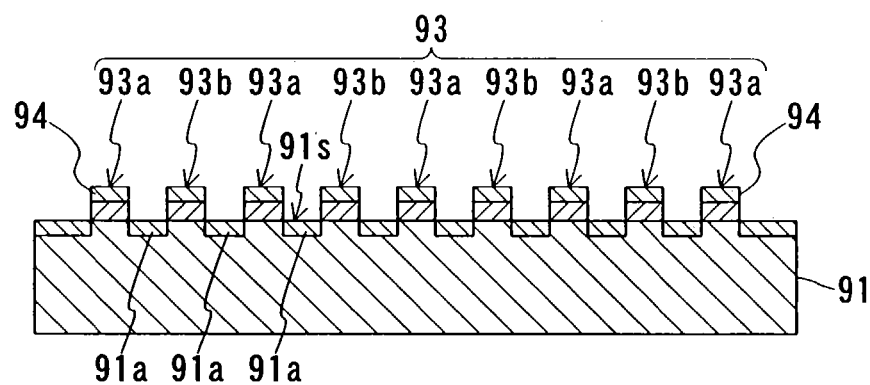

Then, as shown in FIG. 9C, an insulating layer 94 is formed on the surfaces of the IDT electrodes 93a and 93b. At the same time, a doping region 91a is formed in a substrate surface 91s between the IDS electrodes 93a and 93b. The insulating layer 94 and the doping region 91a can be formed by plasma-doping of oxygen ions. The doping of oxygen ions can be performed under the conditions of implantation energy: 5000 eV and dose: $1 \times 10^{17}$ ions/cm$^2$.

Figure 9D:
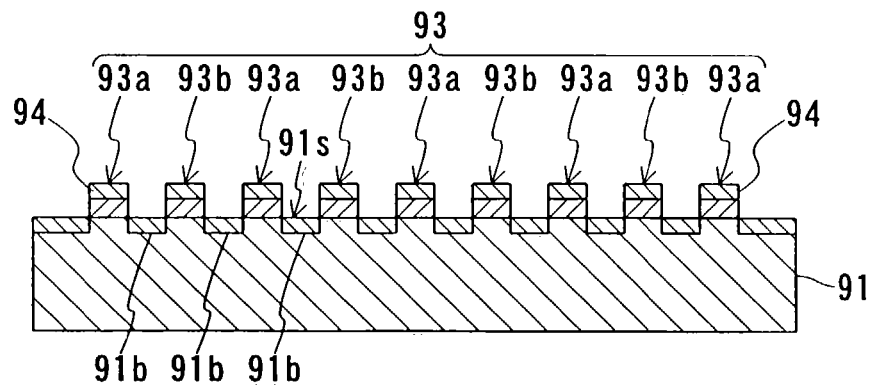

Then, as shown in FIG. 9D, the doping region 91a is doped with boron ions by plasma-doping, so that a doping region 91b having a lower resistance than that of the doping region 91a is formed. The sheet resistance of the doping region 91b is in the range from $10^8 \Omega/\square$ to $10^{15} \Omega/\square$. The doping of boron ions can be performed under the conditions of an implantation energy of 700 eV and a dose of $1 \times 10^{16}$ ions/cm$^2$.

Finally, the SAW device is mounted on a mounting substrate in the same manner as in Example 1.

As described above, in the method of Example 4, the same effects provided by the method of Example 2 can be obtained. Moreover, the method of Example 4 allows the sheet resistance of the doping region 91b to be controlled easily.

Example 5

Figure 10A:
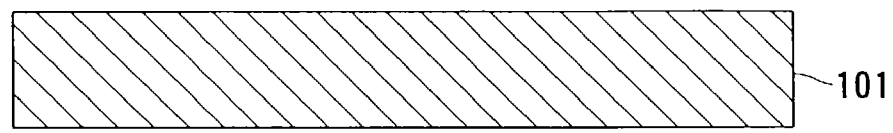
FIGS. 10A to 10C are views showing a process sequence of yet another example of a method for producing a SAW device of the present invention.
Figure 10B:
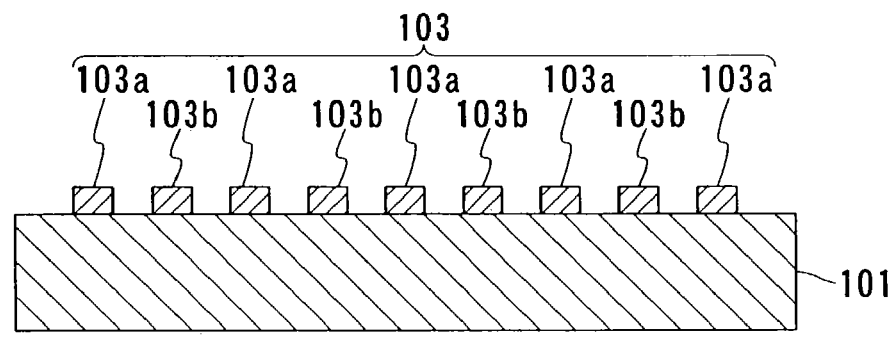
Figure 10C:
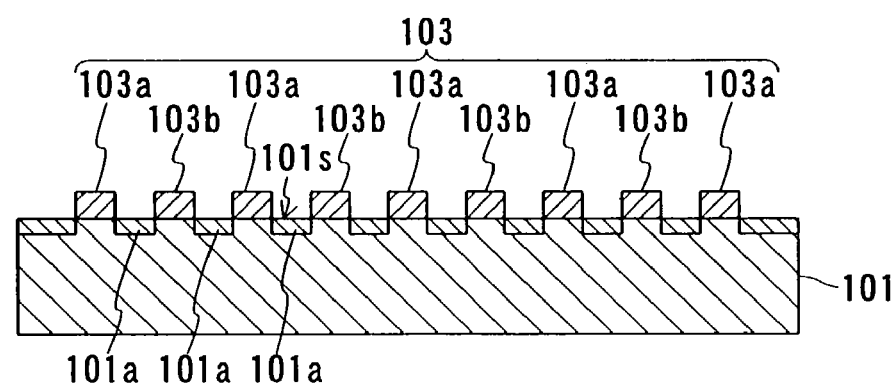

In Example 5, an example of a SAW device actually produced by the method of the present invention will be described. FIGS. 10A to 10C show a production process sequence of the method of Example 5.

First, as shown in FIG. 10A, a substrate 101 made of LiTaO$_3$ was prepared, and the surface thereof was washed.

Then, as shown in FIG. 10B, IDT electrodes 103 including IDT electrodes 103a and 103b were formed. The IDT electrodes were formed in the following manner. First, a metal film (a thickness of 200 nm) made of an Al—Cu alloy (Al:Cu=99.5:0.5) was formed on the substrate 101, and a resist film (a thickness of 1.5 μm) having a predetermined pattern was formed on the metal film. As the resist film, a positive type resist was used. Next, unnecessary portions in the metal film were removed by dry-etching with a mixed gas of BCl$_3$ and Cl$_2$. Finally, the resist film was ashed with oxygen plasma, and thus the IDT electrodes were formed.

Then, as shown in FIG. 10C, a doping region 101a was formed in a substrate surface 101s between the IDT electrodes 103a and 103b. The doping region 101a can be formed by ICP plasma-doping of nitrogen ions. In this case, three types of SAW devices were formed under varied doping conditions. These three types of SAW devices were subjected to a heating test and evaluation of RF characteristics. In addition, the same tests were conducted with respect to a SAW device that was not doped with nitrogen ions as a comparative example. Table 1 shows the doping conditions and the results of the tests with respect to the above samples.

TABLE 1

|  |  | Sample 1 | Sample 2 | Sample 3 | Comparative Ex. |
|---|---|---|---|---|---|
| Doping condition | ICP power (W) | 300 | 300 | 300 | — |
|  | Substrate bias power (W) | 250 | 100 | 100 | — |
|  | Vacuum degree (Pa) | 2 | 2 | 2 | — |
|  | Doping time (sec.) | 120 | 120 | 120 | — |
| Heating test results |  | 7 | 1 | 2 | 100 |
| Loss ΔLoss (db) |  | 0.13 | 1.03 | −0.01 | 0 |

The heating test was performed by heating 100 devices of each type of sample to 50° C. with a hot plate and measuring the number of devices that was damaged by discharge. In Table 1, the number of devices that was damaged of the 100 devices is shown. As the RF characteristics, the mean frequency and the frequency band were measured using a network analyzer.

As shown in Table 1, in the samples 1 to 3 of the present invention, pyroelectric breakdown due to heating was suppressed, compared to the comparative samples. In addition, in the sample 3 of the samples 1 to 3, there was essentially no loss.

Example 6

Figures 11A, 11B:
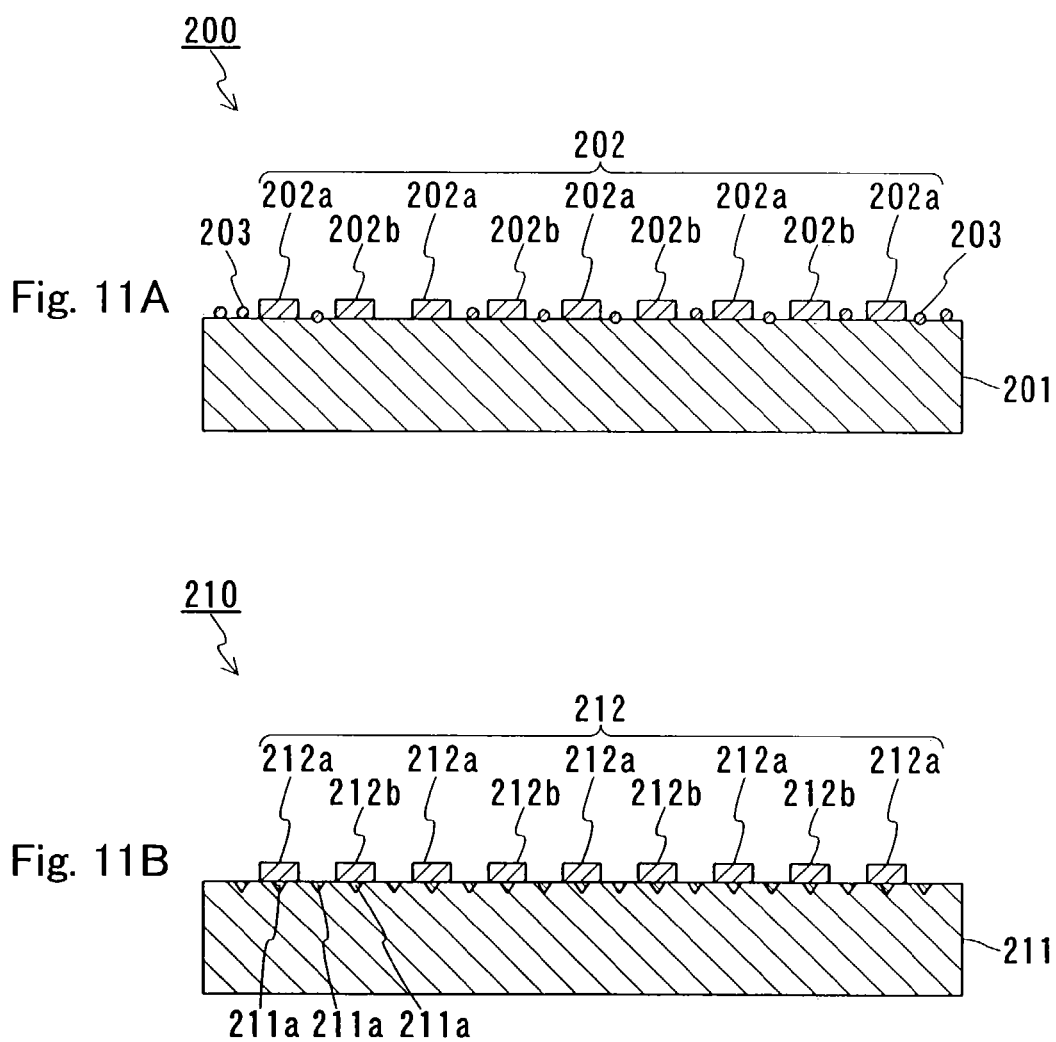
FIG. 11A is a cross-sectional view of yet another example of a SAW device of the present invention.
FIG. 11B is a cross-sectional view of still another example of a SAW device of the present invention.
Figure 12:
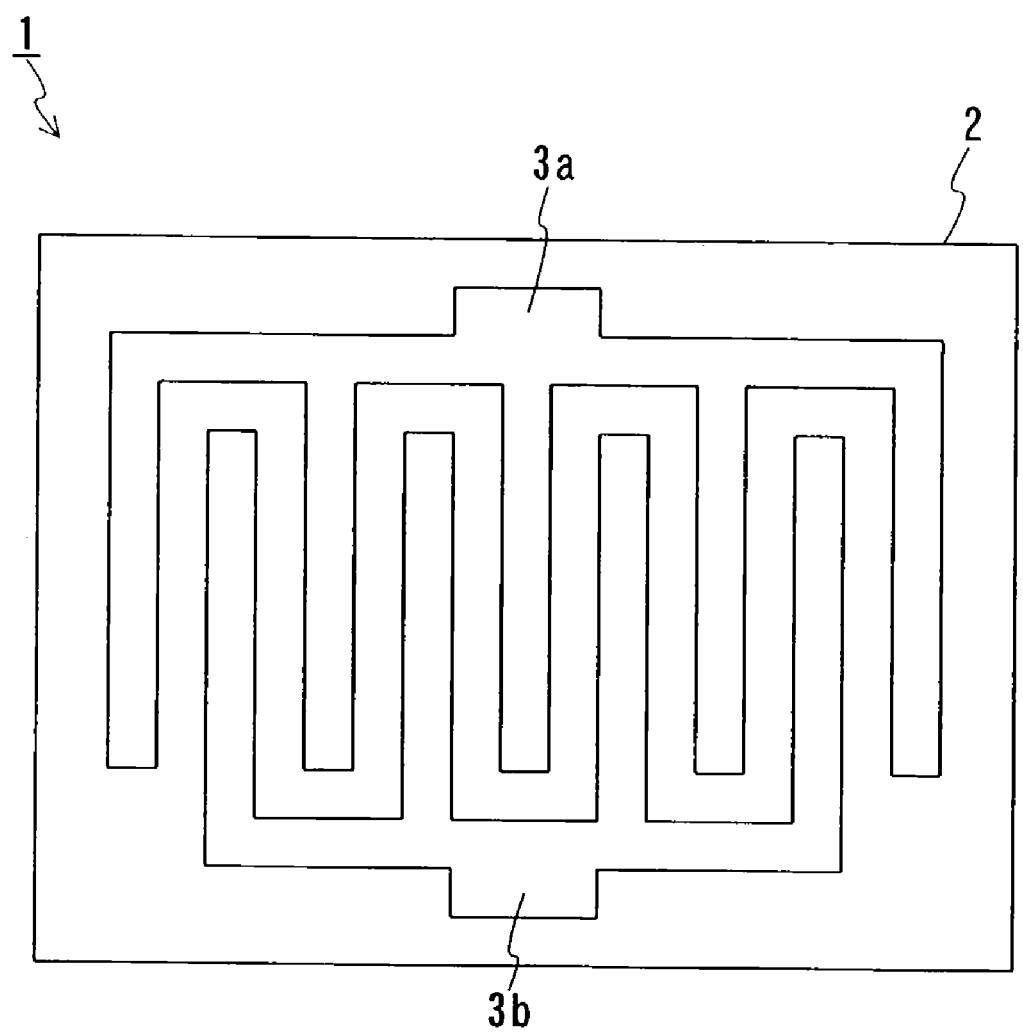
FIG. 12 is a plan view of an example of a conventional SAW device.

Hereinafter, two examples of other SAW devices to prevent piezoelectric breakdown will be described. FIG. 11A is a cross-sectional view of a SAW device 200 of a first example. FIG. 11B is a cross sectional view of a SAW device 210 of a second example.

The SAW device 200 includes a substrate 201 made of piezoelectric material and IDT electrodes 202 formed on the substrate 201. The IDT electrodes 202 include pairs of IDT electrodes 202a and 202b that are opposed to each other. The IDT electrodes 202 are the same as the IDT electrodes 12 described in Embodiment 1.

In the SAW device 200, a plurality of dotted metals 203 are formed on a substrate surface at least between the IDT electrodes 202a and 202b. The metals 203 are separated by a distance that allows a tunnel current to flow between the adjacent metals 203. More specifically, the metals 203 are formed on the substrate at a density of 10 metals/μm$^2$ or more. The metals can be formed, for example by performing a sensitizing treatment and an activating treatment, which are pre-treatments of electroless plating. More specifically as the sensitizing treatment, the substrate 201 is treated with a treatment aqueous solution (SnCl$_2$:10 g/l, HCl:40 ml/l, 323 K). Furthermore, as the activating treatment, the substrate 201 is treated with a treatment aqueous solution (PdCl$_2$:0.2 g/l, HCl:20 ml/l, 323 K). Thus, dotted metals made of palladium can be formed.

In the SAW device 200, when a high voltage is applied across the electrodes, a tunnel current flows via the metals 203, so that discharge between the electrodes can be prevented. Therefore, according to the SAW device 200, discharge breakdown can be prevented during and after the production process. Furthermore, since the metals 203 are insulated, the characteristics of the device are not adversely affected. Furthermore, the SAW device 200 is not affected by environmental changes such as repetition stress and has high reliability.

The dotted metals 203 can be formed by other methods such as utilizing an early state (island-shaped metal) in metal deposition.

The SAW device 210 includes a substrate 211 made of piezoelectric material and IDT electrodes 212 formed on the substrate 211. The IDT electrodes 212 are the same as the IDT electrodes 12 described in Embodiment 1.

The substrate 211 is provided with doping regions 211a (FIG. 11B) formed in stripes. The doping regions may be formed in a mesh. The doping region 211a is formed by doping the substrate with a substance in at least one form selected from the group consisting of atoms, molecules and clusters.

In the SAW device 210, when a high voltage is applied across the electrodes, a tunnel current flows via the doping regions 211a, so that discharge between the electrodes can be prevented. Therefore, according to the SAW device 210, the same effects provided by the SAW device 200 can be obtained. Furthermore, since the doping regions 211a are formed in stripes in the SAW device 210, the direct current resistance is low and the high frequency resistance is high. For this reason, discharge between the electrodes can be prevented, and the same characteristics of a regular SAW device can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a surface acoustic wave device having a piezoelectric substrate, a first interdigital electrode and a second interdigital electrode formed on the substrate so that the first and second interdigital electrodes are opposed to each other, the first and second interdigital electrodes including an insulating layer in surfaces thereof, the method comprising:
   (a) forming the first interdigital electrode and the second interdigital electrode on the piezoelectric substrate so that the first and second interdigital electrodes are opposed to each other;
   (b) forming a doping region in a surface between the first and second interdigital electrodes by doping the surface of the substrate with a substance in at least one form selected from the group consisting of atoms, molecules and clusters before or after the process (a); and
   (c) forming the insulating layer in surfaces of the first and second interdigital electrodes by doping the surfaces of the first and second interdigital electrodes with impurities after the process (a),
   wherein the processes (b) and (c) are performed at the same time by doping with the substance used for the process (b).

2. The method for producing a surface acoustic wave device according to claim 1, wherein the substrate is doped with the substance in a depth of not more than 50 nm from the surface of the substrate.

3. The method for producing a surface acoustic wave device according to claim 1, wherein the doping region has a lower resistance than that of an inner portion of the substrate.

4. The method for producing a surface acoustic wave device according to claim 3, wherein a sheet resistance of the doping region is in a range from $10^8 \Omega/\square$ to $10^{15}\Omega/\square$.

5. The method for producing surface acoustic wave device according to claim 1, wherein the substrate is doped with the substance in ionized form.

6. The method for producing a surface acoustic wave device according to claim 5, wherein a dose of the substance is in a range from $1\times10^{13}$ ions/cm$^2$ to $1\times10^{17}$ ions/cm$^2$.

7. The method for producing a surface acoustic wave device according to claim 5, wherein the substrate is doped with the substance at an energy of 0.01 keV to 10 keV.

8. The method for producing a surface acoustic wave device according to claim 5, wherein the substance is a substance obtained by ionizing at least one selected from the group consisting of a reducing gas, silane, nitrogen, oxygen, argon, silicon, arsenic, boron, phosphorus, tin, indium, chromium, tantalum, molybdenum, germanium, and nickel.

9. The method for producing a surface acoustic wave device according to claim 1, wherein the substrate is doped with the substance by at least one technique selected from the group consisting of ion implantation, ion doping, plasma doping, laser doping and vapor phase doping.

10. The method for producing a surface acoustic wave device according to claim 1, wherein the impurities are the same substance as said substance, and the process (c) is performed at the same time as the process (b).

11. The method for producing a surface acoustic wave device according to claim 1, wherein the impurities are oxygen or nitrogen.

12. The method for producing a surface acoustic wave device according to claim 1, wherein an average thickness of the insulating layer is in a range from 2 nm to 500 nm, and a resistivity of the insulating layer is not less than $10^6 \Omega$ cm.

* * * * *